United States Patent
Copetti et al.

(10) Patent No.: US 6,545,225 B2
(45) Date of Patent: Apr. 8, 2003

(54) MODULE WITH THIN-FILM CIRCUIT

(75) Inventors: Carlo Copetti, Nijmegen (NL); Martin Fleuster, Aachen (DE); Franciscus Hubertus Marie Sanders, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/746,029

(22) Filed: Dec. 21, 2000

(65) Prior Publication Data

US 2001/0017770 A1 Aug. 30, 2001

(30) Foreign Application Priority Data

Dec. 21, 1999 (DE) .......................... 199 61 683

(51) Int. Cl.$^7$ ................................. H05K 1/16
(52) U.S. Cl. .................... 174/260; 174/261; 174/262
(58) Field of Search ................................. 174/260, 261, 174/262–266; 361/767–771, 772, 808

(56) References Cited

U.S. PATENT DOCUMENTS

| 5,936,843 | A | * | 8/1999 | Ohshima et al. | 361/760 |
| 6,178,093 | B1 | * | 1/2001 | Bhatt et al. | 361/795 |
| 6,326,561 | B1 | * | 12/2001 | Watanabe et al. | 174/264 |

* cited by examiner

*Primary Examiner*—Albert W. Paladini
*Assistant Examiner*—Jeremy Norris
(74) *Attorney, Agent, or Firm*—Steven R. Biren

(57) ABSTRACT

A module is provided with a thin-film circuit. To realize the module with a thin-film circuit, capacitors, or capacitors and resistors, or capacitors, resistors and inductors are provided next to the conductor tracks directly on a substrate (1) of an insulating material. The partial or full integration of passive elements leads to the creation of a module which is very compact.

14 Claims, 5 Drawing Sheets

MODULE WITH THIN-FILM CIRCUIT

BACKGROUND OF THE INVENTION

The invention relates to a module provided with a thin-film circuit on a substrate of an insulating material, a method of manufacturing a module with a thin-film circuit, and a thin-film circuit.

The development of numerous electronic devices is characterized by the following trends: miniaturization, lower or at least constant prices accompanied by an enhanced functionality, higher reliability, and a lower energy consumption. Experience has shown that the number of passive components accounts for 70% of the number of components present in many consumer electronics appliances, for example in TV sets or video recorders. But it is also the stormy developments in the field of mobile telephony and the continuing miniaturization of the cordless telephone appliances which lead to higher requirements being imposed on the individual components.

A step on the road to a continuing miniaturization is provided by the so-called SMD technique. This technique is based on miniaturized components (SMDs=Surface Mounted Devices) which are directly mounted on the surfaces of printed circuit boards or ceramic substrates provided with conductor strips. SMDs are substantially smaller than corresponding components with traditional wiring. If used consistently, the surface or space requirements and the weight of circuits can be reduced by a factor two or three. It is also possible through an optimum application of the SMD technique to achieve a cost saving, because smaller printed circuit boards can be used.

A power amplifier module for the high-frequency unit of a mobile telephone is also manufactured by this technique nowadays. Conductor strips are provided on a substrate in a printing process. The substrate serves as a carrier for active components such as, for example, amplifiers, and passive components such as, for example, resistors, capacitors, and inductors. The active components are in that case fastened in the form of ICs by a bonding method, and the passive components are soldered thereon as SMD components.

A further miniaturization, however, also renders the manufacture, handling, and mounting of passive SMD components increasingly difficult. This can be avoided in that integrated passive components (IPCs) are used. In this technique, passive components such as, for example, resistors (R), capacitors (C), or inductors (L) are combined into inseparable basic circuits and systems. So-called thin-film circuits are obtained through the use of thin-film techniques by means of masks on carrier plates made of an insulating material, which circuits are the equivalents of very strongly reduced printed circuits. The manufacture of thin-film circuits is known and is generally achieved by means of several consecutive coating and structuring processes. Several layers of various shapes, compositions, and thicknesses are to be provided in order to realize a thin-film circuit, which consists of a combination of resistors, capacitors, and/or inductors.

A simple realization of circuits with widely differing passive and active components is possible through a combination of discrete (SMD) components with active components which have a special function (for example, a filtering function). A disadvantage is, however, that SMD components all have to be soldered individually. Large surface areas are required on account of the solder spots, which makes the circuits very bulky.

SUMMARY OF THE INVENTION

The invention has for its object to provide a module with a thin-film circuit comprising passive components or comprising passive and active components on a substrate of an insulating material which requires only little space.

This object is achieved by means of a module provided with a thin-film circuit on a substrate of an insulating material with at least one passive element, which element comprises at least a first structured electrically conducting layer, a dielectric, and a second electrically conducting layer, and with a protective layer, as well as at least one contact hole which passes through the module, and a metallization which covers the module and the contact hole.

Not only the conductor strips, but also at least one passive element such as, for example, a capacitor is provided on a substrate in this thin-film circuit. This direct integration of passive elements renders it possible to realize the entire thin-film circuit with a substantially reduced space requirement.

In a particularly preferred embodiment, a resistance layer is provided between the substrate and the first structured electrically conducting layer, such that the thin-film circuit comprises at least one resistor.

It is preferred that the substrate of insulating material comprises a ceramic material, a glass-ceramic material, a glass material, or a ceramic material with a planarizing layer of glass or of an organic material.

A substrate made of these materials can be inexpensively manufactured, and the process cost for these components can be kept low. The substrate in this case constitutes the carrier for discrete components and ICs.

It is particularly preferred that the substrate of insulating material comprises $Al_2O_3$, glass, or $Al_2O_3$ with a planarizing layer of glass or of an organic material.

These materials are compatible with the thin-film technology and have an acceptable surface roughness. $Al_2O_3$ is particularly suitable as a substrate on account of its mechanical stability and thermal conductivity.

It is furthermore preferred that a barrier layer is provided between the substrate and the first structured electrically conducting layer or between the substrate and the resistance layer.

Reactions with the dielectric as well as rough surfaces of the electrically conducting layers, which will lead to short-circuits of the capacitors or bad high-frequency properties, can be prevented by a barrier layer.

It is advantageous when the first and second structured electrically conducting layers comprise Cu, Al doped with Cu, Al doped with Mg, Al doped with Si, or Al doped with Cu and Si.

It is furthermore preferred that the resistance layer comprises $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Cu_xNi_y$ ($0 \leq x \leq 1$, $0 \leq y \leq 1$), or $Ti_xW_y$ ($0 \leq x \leq 1$, $0 \leq y \leq 1$).

These materials are structured after being deposited, for example by means of lithographic processes in combination with wet and dry etching steps, depending on the functions which the layers are to fulfill in the thin-film circuit.

It is furthermore advantageous that the dielectric comprises $Si_3N_4$, $SiO_2$, $Si_xO_yN_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), or $Ta_2O_5$.

All these materials have a relative dielectric constant $\epsilon_r > 4$ and thus enable high capacitance values combined with small dimensions.

It is preferred that the protective layer comprises an inorganic material.

The protective layer protects the subjacent layers against mechanical loads and corrosion by moisture.

It is furthermore preferred that the structured metallization comprises a base layer and a covering layer.

In this embodiment, the base layer acts as a nucleating layer for the electrochemical deposition of the covering layer of the structured metallization.

It is highly preferred that discrete components are provided on the side of the substrate opposed to the thin-film circuit.

This utilization of a wafer on both sides can further enhance the packing density.

The invention further relates to a method of manufacturing a module provided with a thin-film circuit on an insulating substrate with at least one passive component, whereby

- a first electrically conducting layer is deposited on a substrate and structured,
- a dielectric is deposited on the first structured electrically conducting layer,
- a second electrically conducting layer is deposited on the dielectric and structured,
- a protective layer is provided on the second structured electrically conducting layer,
- the dielectric and the protective layer are structured,
- at least one contact hole passing through the module is created, and
- a structured metallization is provided over the module and the contact hole.

In a particularly preferred embodiment, a first step is that a barrier layer is deposited on the substrate.

In an especially preferred embodiment, a resistance layer is first provided on the substrate or on the barrier layer and is structured.

It is furthermore preferred that the contact hole is created as a first step or after the provision of the protective layer.

Depending on the manufacturing process, the contact hole may be created after the protective layer has been provided, or already before the conductor strips and passive integrated components are provided by means of thin-film techniques.

It is preferred that, for the manufacture of the structured metallization, first a base layer is deposited over the module and in the contact hole,

- then a layer of photoresist is deposited on the base layer and is structured in accordance with the desired structure of the metallization,
- a covering layer is deposited on the base layer, and
- the photoresist and certain portions of the base layer are removed.

The invention also relates to a thin-film circuit on a substrate of an insulating material provided with at least one passive component, which component comprises at least

- a first structured electrically conducting layer,
- a dielectric,
- a second electrically conducting layer,
- and provided with a protective layer,
- with at least one contact hole which passes through the substrate, and
- with a structured metallization which covers the protective layer and the contact hole.

The invention will be explained in more detail below with reference to five Figures and three embodiments.

DESCRIPTION OF THE PREFERRED EMBODIMENTS

Figure 1:
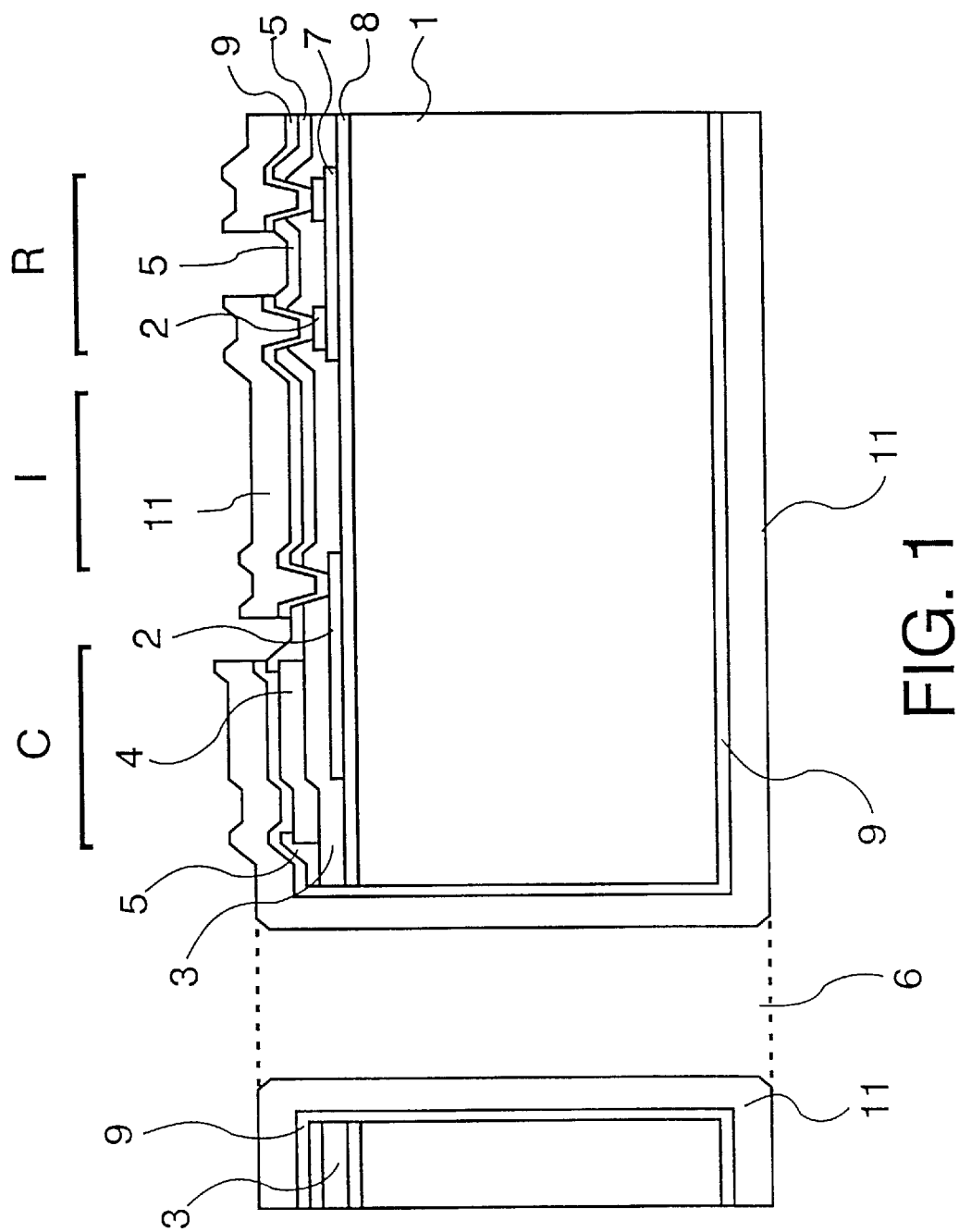
FIG. 1 diagrammatically shows in cross-section the construction of a module according to the invention provided with a thin-film circuit comprising a capacitor, a resistor and a conductor strip inductor.

In FIG. 1, a module with a thin-film circuit has a substrate 1 which comprises, for example, a ceramic material, a glass-ceramic material, a glass material, or a ceramic material with a planarizing layer of glass or of an organic material. Preferably, the substrate 1 comprises $Al_2O_3$, glass, $Al_2O_3$ with a planarizing layer of glass, polyamide, or polybenzocyclobutene. A barrier layer 8 may be provided on this substrate 1, comprising, for example, $Si_3N_4$. A resistance layer 7 is deposited on the substrate 1 or the barrier layer 8 and is structured. This structured resistance layer 7 may comprise, for example, $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$) $Cu_xNi_y$ ($0 \leq x \leq 1$, $0 \leq y \leq 1$), or $Ti_xW_y$ ($0 \leq x \leq 1$, $0 \leq y \leq 1$). A first electrically conducting layer 2 is provided on this resistance layer 7 and is structured. A dielectric 3 is present on this structured first electrically conducting layer L, which dielectric 3 will normally cover the entire surface area of the substrate 1 and is interrupted in certain locations only so as to create vias to the subjacent first structured electrically conducting layer 2. The dielectric 3 may comprise, for example, $Si_3N_4$, $SiO_2$, $Si_xO_yN_z$ ($0 \leq x \leq 1$, $0 \leq y \leq 1$, $0 \leq z \leq 1$), or $Ta_2O_5$. A second electrically conducting layer 4 is deposited on the dielectric 3 and is structured. The first electrically conducting layer 2 and the second electrically conducting layer 4 may comprise, for example, Cu, Al, Al doped with a few percents of Cu, Al doped with a few percents of Si, Al doped with a few percents of Mg, or Al doped with a few percents of Cu and Si. A structured protective layer 5 of an inorganic material such as, for example, $SiO_2$, $Si_3N_4$, or $Si_xO_yN_z$ ($0 \leq x \leq 1$, $0 \leq y \leq 1$, $0 \leq z \leq 1$), lies over the entire surface area of the substrate 1. Alternatively, however, an organic material such as, for example, polyamide or polybenzocyclobutene may be used. The module provided with a thin-film circuit in addition has at least one contact hole 6. The module as well as the contact hole 6 are surrounded by a structured metallization, which in its turn comprises a base layer 9. It may be preferred that one or several further metal layers are provided on the base layer 9. In that case the base layer 9, which comprises, for example, Cr/Cu, serves as a nucleating layer for the electrochemical deposition of a covering layer 11. The covering layer 11 comprises, for example, Cu/Ni/Au.

In addition, current supply contacts may be fastened to mutually opposed sides of the module. An electroplated SMD end contact of Cr/Cu, Ni/Sn, or Cr/Cu, Cu/Ni/Sn, or Cr/Ni, Pb/Sn, a bump end contact, a castellation of Cr/Cu, Cu/Ni/Au, a ball grid array comprising a Cr/Cu/Ni layer with a ball of Sn or a PbSn alloy arranged thereon, or a land grid array of Cr/Cu may be used as the current supply contact.

Such a module provided with a thin-film circuit may be used, for example, in the manufacture of a power amplifier for the high-frequency unit of a mobile telephone.

Figure 2:
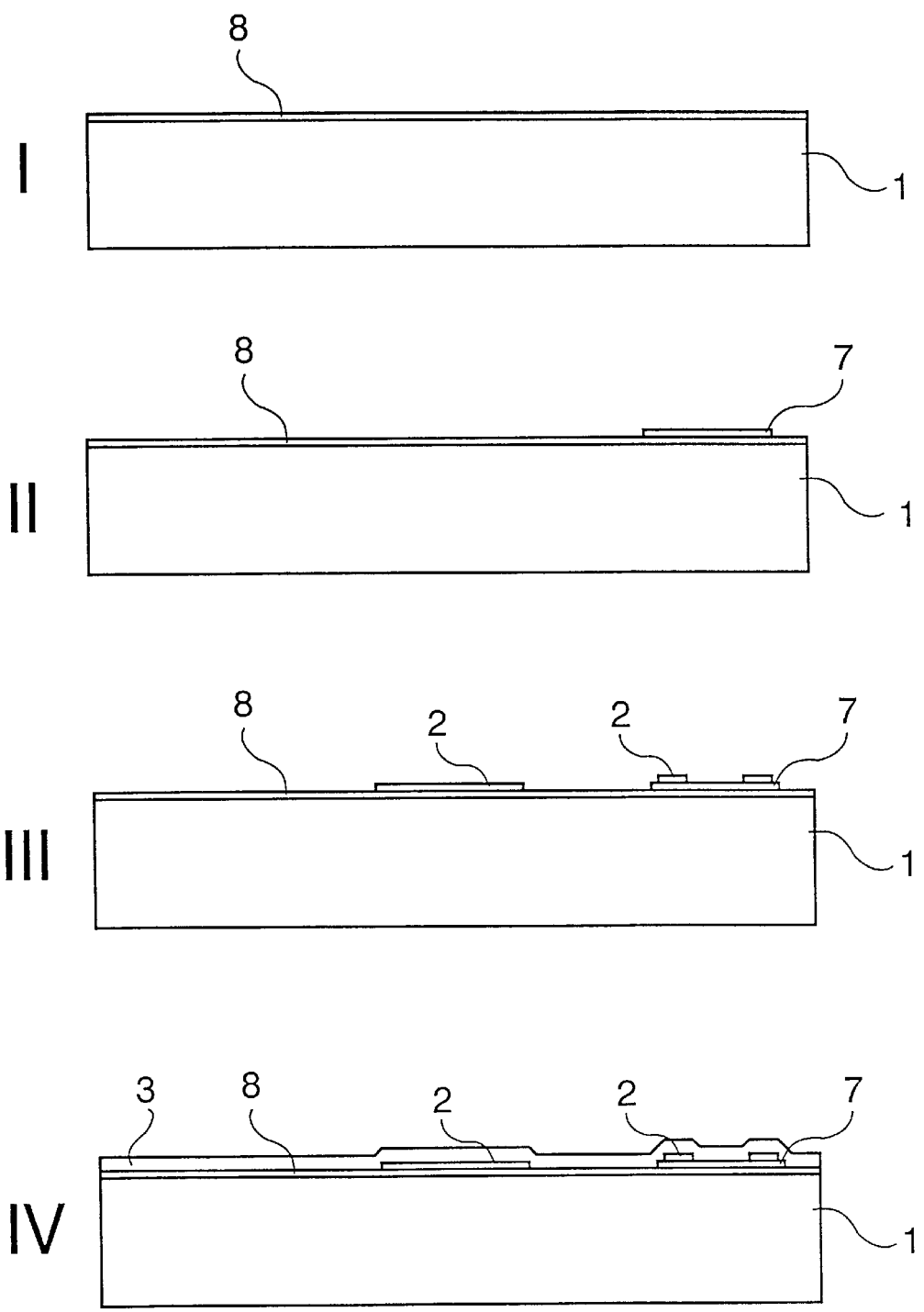
FIGS. 2 to 5 show manufacturing sequences for a module with a thin-film circuit.
Figure 3:
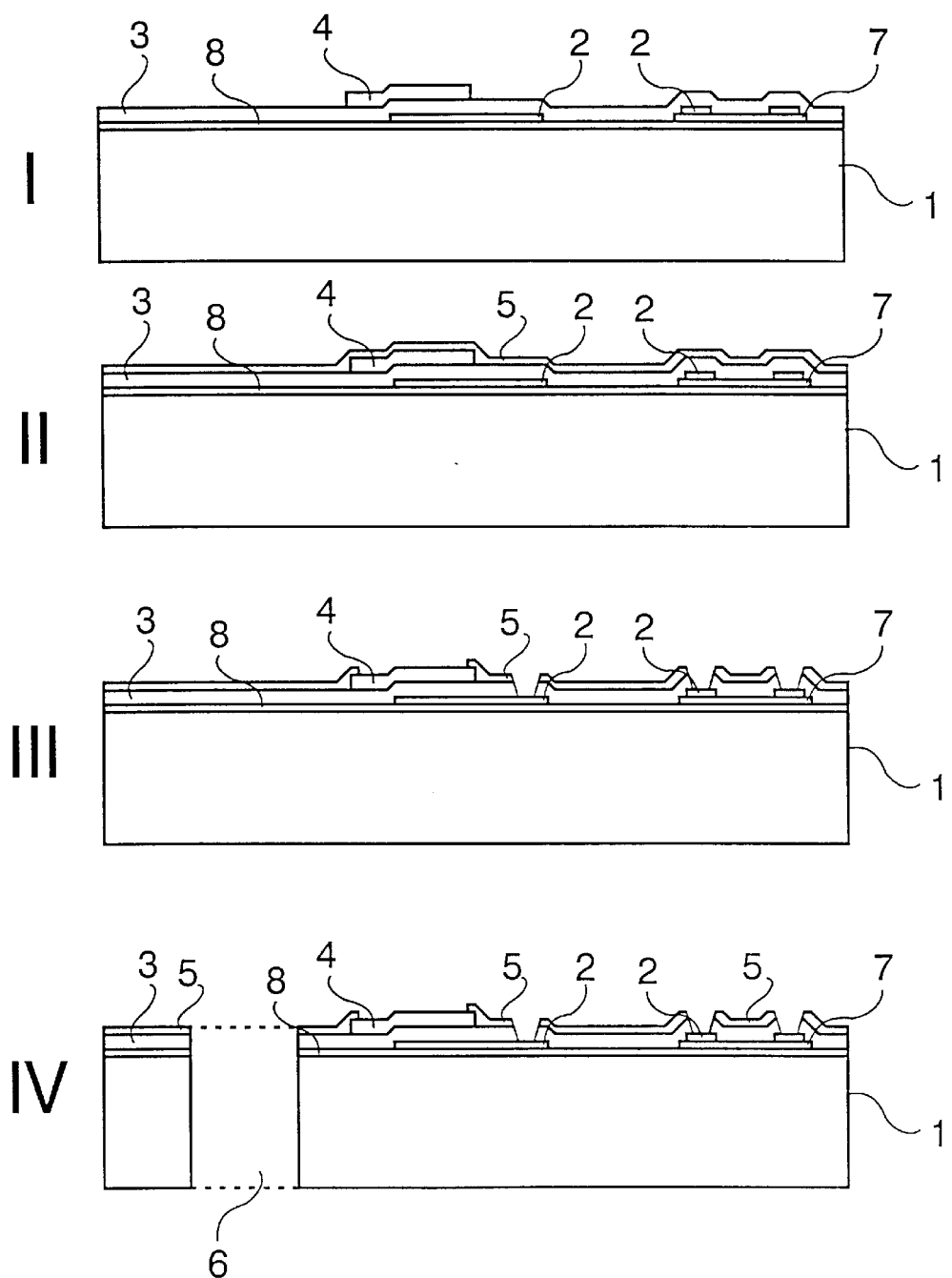

In the manufacture of a module with a thin-film circuit, a barrier layer 8, for example comprising $S_3N_4$, may be deposited in process step I of FIG. 2 on a substrate 1, which substrate comprises, for example, a ceramic material, a glass-ceramic material, a glass material, or a ceramic material with a planarizing layer of glass or of an organic material such as, for example, polyamide or polybenzocyclobutene. A resistance layer 7 may be deposited and structured (step II in FIG. 2) on the barrier layer 8 or alternatively on the substrate 1. The resistance layer 7 may comprise, for example, $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Cu_xNi_y$ ($0 \leq x \leq 1$, $0 \leq y \leq 1$), or $Ti_xW_y$ ($0 \leq x \leq 1$, $0 \leq y \leq 1$). A first electrically conducting layer 2 is deposited on the barrier layer 8 or alternatively on the substrate 1 and on parts of the resistance layer 7 and is structured (step III in FIG. 2). A dielectric 3 is deposited over the entire surface of the substrate 1 (step IV in FIG. 2). The dielectric 3 preferably comprises $Si_3N_4$, $SiO_2$, $Si_xO_yN_z$ ($0 \leq x \leq 1$, $0 \leq y \leq 1$, $0 \leq z \leq 1$), or $Ta_2O_5$. In step I in FIG. 3, a second electrically conducting layer 4 is subsequently deposited on the dielectric 3 and structured. The first electrically conducting layer 2 and the second electrically conducting layer 4 may comprise, for example, Cu, Al, Al doped with a few percents of Cu, Al doped with a few percents of Si, Al doped with a few percents of Mg, or Al doped with a few percents of Cu and Si. In step II in FIG. 3, a protective layer 5 of an inorganic material is provided over the entire thin-film circuit. Inorganic materials which may be used are, for example, $Si_3N_4$, $SiO_2$, or $Si_xO_yN_z$ ($0 \leq x \leq 1$, $0 \leq y \leq 1$, $0 \leq z \leq 1$). Alternatively, an organic material such as, for example, polybenzocyclobutene or polyamide may be used as the material for the protective layer. Subsequently, the protective layer 5 and the dielectric 3 are structured (step III in FIG. 3). This may take place by means of photolithographic processes in the case of photosensitive materials, or alternatively by means of wet chemical or dry etching. In addition, at least one contact hole 6 which passes through the substrate 1 is created by means of a laser (step IV in FIG. 3).

Figure 4:
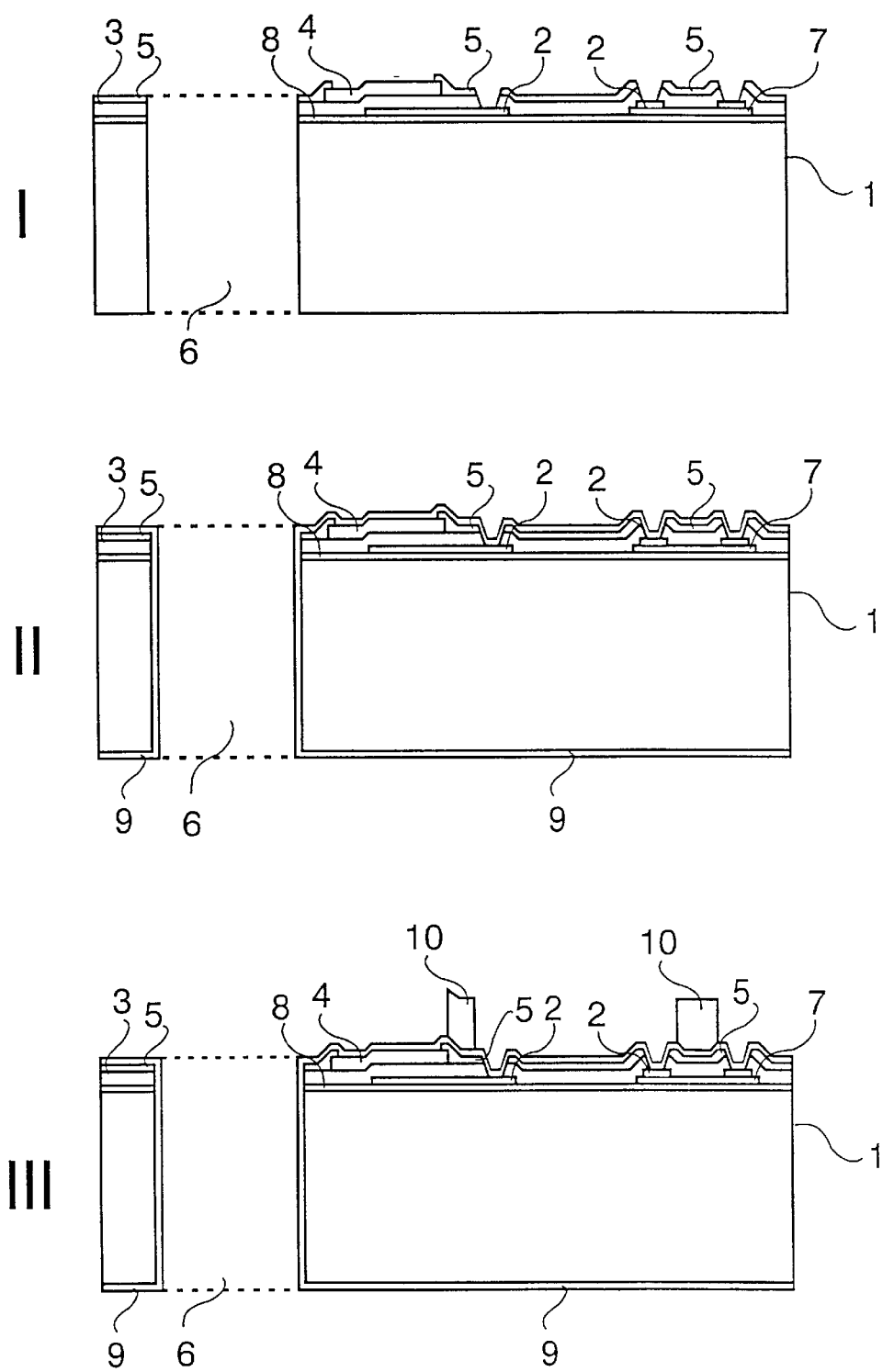
Figure 5:
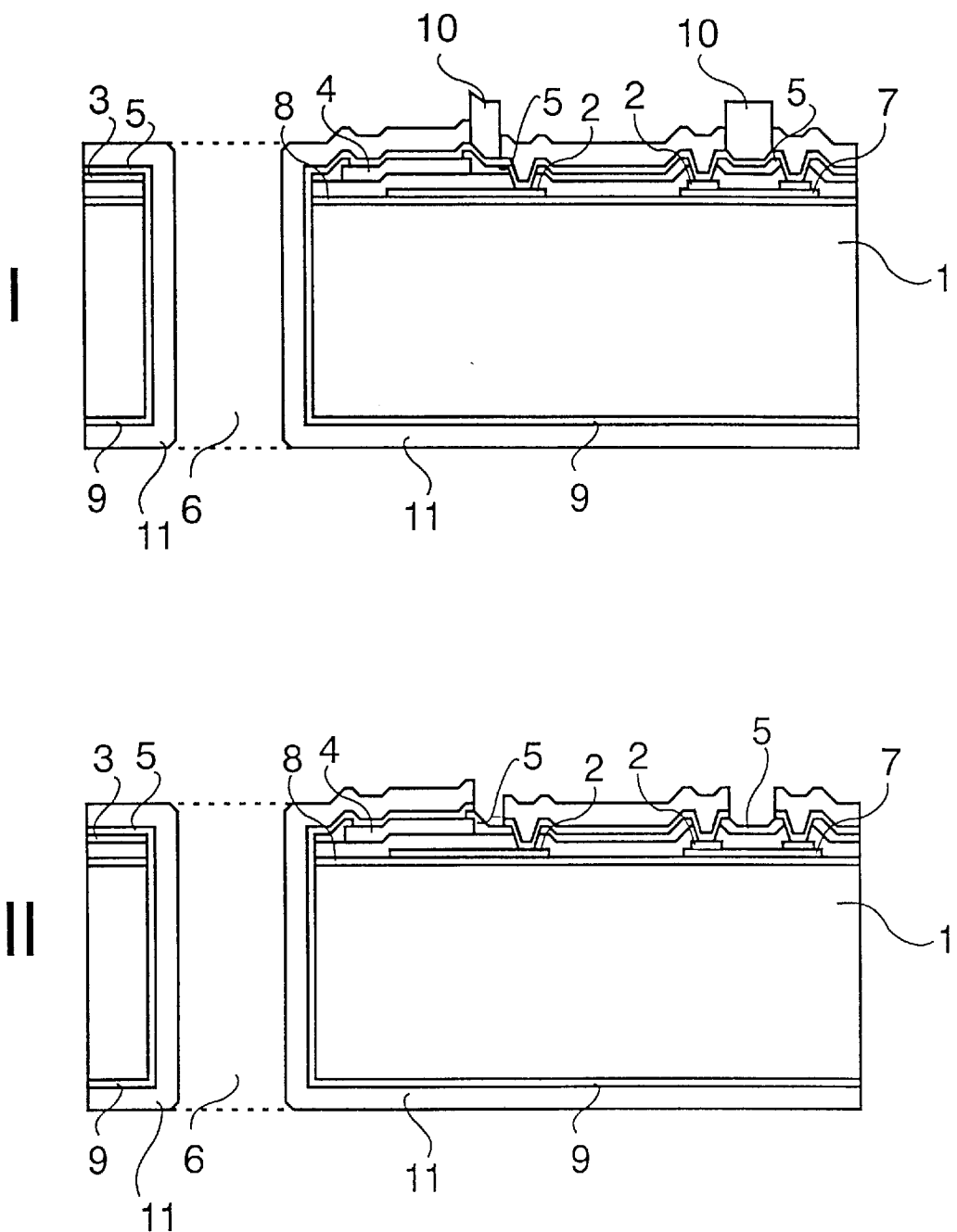

In step II in FIG. 4, first a base layer 9 covering the module and the contact hole 6 is provided for the purpose of realizing the structured metallization. This base layer comprises, for example, Cr/Cu. In the next step, a layer of photoresist 10 is deposited on the base layer 9 and structured by means of photolithographic processes such that the layer of photoresist 10 has the pattern of the desired structure of the metallization (step III in FIG. 4). Then a covering layer 11, for example comprising Cu/Ni/Au, is deposited electrochemically on the base layer 9 (step II in FIG. 5). After removal of the photoresist 10, the portions of the base layer 9 not covered by the covering layer 11 are removed in an etching bath.

In addition, current supply contacts may be fastened to mutually opposed sides of the module. An electroplated SMD end contact of Cr/Cu, Ni/Sn, or Cr/Cu, Cu/Ni/Sn, or Cr/Ni, Pb/Sn, a bump end contact, a castellation of Cr/Cu, Cu/Ni/Au, a ball grid array comprising a Cr/Cu/Ni layer with a ball of Sn or a PbSn alloy arranged thereon, or a land grid array of Cr/Cu may be used as the current supply contact.

Alternatively, a contact hole 6 may be created before the conductor tracks and passive integrated elements have been provided by thin-film techniques.

Embodiments of the invention will be explained below, representing examples of how the invention may be realized in practice.

Embodiment 1

A structured barrier layer 8 of $Si_3N_4$ was provided on a substrate 1 of $Al_2O_3$ with a planarizing layer of glass. A resistance layer 7 of $Ni_{0.3}Cr_{0.6}Al_{0.1}$ was deposited on the barrier layer 8 and structured. A first electrically conducting layer 2 of Al doped with 4% Cu as deposited on a portion of the resistance layer 7 and on portions of the barrier layer 8 and as structured. In the next step, a dielectric 3 of $Si_3N_4$ was deposited over the entire surface of the substrate 1. A second electrically conducting layer 4 of Al doped with 4% Cu was deposited on the dielectric 3 and structured. The complete thin-film circuit was provided with a protective layer 5 of $Si_3N_4$. The dielectric 3 and the protective layer were structured so as to enable a subsequent electrical contacting of the first electrically conducting layer and/or the resistance layer 7. Furthermore, several contact holes 6 passing through the substrate 1 were created by means of a laser. A metallization comprising a base layer 9 of Cr/Cu and a covering layer 11 of Cu/Ni/Au was provided around the module and in the contact holes 6. In addition, ball grid arrays comprising a layer of Cr/Cu/Ni and balls of Sn were fastened to both sides of the module as current supply contacts.

The module was fitted with a thin-film circuit for creating a power amplifier for the high-frequency unit of a mobile telephone through a further provision of suitable passive and active elements.

Embodiment 2

A barrier layer 8 of $Si_3N_4$ was provided on a substrate 1 of $Al_2O_3$ and structured. A first electrically conducting layer 2 of Al doped with 4% Cu was deposited on the barrier layer 8 and structured. In the next step, a dielectric 3 of $Ta_2O_5$ was deposited on the entire surface of the substrate 1 and structured. A second electrically conducting layer 4 of Al doped with 4% Cu was deposited on the dielectric 3 and structured. The entire thin-film circuit was provided with a protective layer 5 of $Si_3N_4$. Furthermore, several contact holes 6 passing completely through the substrate 1 were created by means of a laser. A metallization comprising a base layer 9 of Cr/Cu and a covering layer 11 of Cu/Ni/Au was provided around the entire component and in the contact holes 6. Castellations of Cr/Cu, Cu/Ni/Au were fastened to both sides of the module as current supply contacts.

The module with thin-film circuit thus obtained was further used for the manufacture of a bandpass filter in mobile telephones.

Embodiment 3

For the manufacture of a module with a thin-film circuit, a barrier layer 8 of $Si_3N_4$ was deposited on a substrate 1 of $Al_2O_3$ with a glass planarizing layer and structured. A resistance layer 7 of $Ti_{0.1}W_{0.9}$ was deposited on this barrier layer 8 and structured. Then a first electrically conducting layer 2 was deposited and structured. A dielectric 3 of $Si_3N_4$ was deposited on this first structured electrically conducting layer 2. A second electrically conducting layer 4 was then deposited on this dielectric 3 and structured. The first electrically conducting layer 2 and the second electrically conducting layer 4 comprised Al doped with 4% Si. A protective layer 5 of $Si_3N_4$ was provided over the module. Vias were etched through the protective layer 5 and the dielectric 3 for electrical contacting. Subsequently, several contact holes 6 were created with a laser, so as to pass fully through the substrate 1. In the next step, a base layer comprising Cr/Cu was deposited around the module and in the contact holes 6. Then a photoresist layer 10 was provided on the base layer 9. This photoresist layer 10 was structured in photolithographic processes such that the photoresist layer 10 was given the pattern of the desired metallization structure. In the next step, a covering layer 11 of Cu/Ni/Au was deposited electrochemically on the base layer 9 of Cr/Cu, whereupon the photoresist 10 was removed. In addition, ball grid arrays comprising a layer of Cr/Cu/Ni and balls of Sn were fastened to both sides of the module as current supply contacts.

What is claimed is:

1. A module provided with a thin-film circuit on a substrate (1) of an insulating material with at least one passive element, which element comprises at least
    a first structured electrically conducting layer (2),
    a dielectric (3), and
    a second electrically conducting layer (4),
    and with a protective layer (5),
    as well as at least one contact hole (6) which passes through the module,
    a metallization which covers the module and the contact hole (6), and a resistance layer (7) provided between the substrate (1) and the first structured electrically conducting layer (2).

2. A module provided with a thin-film circuit as claimed in claim 1, characterized in that the substrate (1) of insulating material comprises a ceramic material, a glass-ceramic material, a glass material, or a ceramic material with a planarizing layer of glass or of an organic material.

3. A module provided with a thin-film circuit as claimed in claim 2, characterized in that the substrate (1) of insulating material comprises $Al_2O_3$, glass, or $Al_2O_3$ with a planarizing layer of glass or of an organic material.

4. A module provided with a thin-film circuit as claimed in claim 1, characterized in that a barrier layer (8) is provided between the substrate (1) and the first structured electrically conducting layer (2) or between the substrate (1) and the resistance layer (7).

5. A module provided with a thin-film circuit as claimed in claim 1, characterized in that the first and second structured electrically conducting layers (2, 4) comprise Cu, Al doped with Cu, Al doped with Mg, Al doped with Si, or Al doped with Cu and Si.

6. A module provided with a thin-film circuit as claimed in claim 1, characterized in that the resistance layer (7) comprises $Ni_xCr_yAl_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Cu_xNi_y$ ($0 \leq x \leq 1$, $0 \leq y \leq 1$), or $Ti_xW_y$ ($0 \leq x \leq 1$, $0 \leq y \leq 1$).

7. A module provided with a thin-film circuit as claimed in claim 1, characterized in that the dielectric (3) comprises $Si_3N_4$, $SiO_2$, $Si_xO_yN_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z1$), or $Ta_2O_5$.

8. A module provided with a thin-film circuit as claimed in claim 1, characterized in that the protective layer (5) comprises an inorganic material.

9. A module provided with a thin-film circuit as claimed in claim 1, characterized in that the structured metallization comprises a base layer (9) and a covering layer (10).

10. A method of manufacturing a module provided with a thin-film circuit on a substrate (1) of insulating material with at least one passive component, characterized in that
    first a barrier layer (8) is deposited on the substrate (1);
    a first electrically conducting layer (2) is deposited over the substrate (1) and structured,
    a dielectric (3) is deposited on the first structured electrically conducting layer (2),
    a second electrically conducting layer (4) is deposited on the dielectric (3) and structured,
    a protective layer (5) is provided on the second structured electrically conducting layer (4),
    the dielectric (3) and the protective layer (5) are structured,
    at least one contact hole (6) passing through the module is created, and
    a structured metallization is provided over the module and the contact hole (6).

11. A method as claimed in claim 10, characterized in that a resistance layer (7) is provided on the substrate (1) or on the barrier layer and is structured.

12. A method as claimed in claim 10, characterized in that the contact hole (6) is created as a first step or after the provision of the protective layer (5).

13. A method as claimed in claim 10, characterized in that, for the manufacture of the structured metallization,
    first a base layer (9) is deposited over the module and in the contact hole (6),
    then a layer of photoresist (10) is deposited on the base layer (9) and is structured in accordance with the desired structure of the metallization,
    a covering layer (11) is deposited on the base layer (9), and
    the photoresist (10) and certain portions of the base layer (9) are removed.

14. A thin-film circuit on a substrate (1) of an insulating material provided with at least one passive component, which component comprises at least
    a first structured electrically conducting layer (2),
    a dielectric (3),
    a second electrically conducting layer (4),
    and provided with a protective layer (5),
    with at least one contact hole (6) which passes through the substrate (1),
    with a structured metallization which covers the protective layer (5) and the contact hole (6) and a resistance layer (7) provided between the substrate (1) and the first structured electrically conducting layer (2).

* * * * *